(12) United States Patent
Woodard et al.

(10) Patent No.: US 6,707,610 B1
(45) Date of Patent: Mar. 16, 2004

(54) REDUCING THE SUSCEPTIBILITY OF TITANIUM NITRIDE OPTICAL LAYERS TO CRACK

(75) Inventors: Floyd E. Woodard, San Jose, CA (US); Yisheng Dai, San Jose, CA (US)

(73) Assignees: Huper Optik International Pte Ltd (SG); Southwall Technologies, Inc., Palo Alto, CA (US)

(*) Notice: Subject to any disclaimer, the term of this patent is extended or adjusted under 35 U.S.C. 154(b) by 0 days.

(21) Appl. No.: 10/251,248

(22) Filed: Sep. 20, 2002

(51) Int. Cl.[7] .............................. G02B 5/28; B05D 5/06
(52) U.S. Cl. ..................... 359/582; 359/585; 359/900; 427/162
(58) Field of Search .................... 359/360, 582, 359/585, 900; 427/162

(56) References Cited

U.S. PATENT DOCUMENTS

| | | | |
|---|---|---|---|
| 4,302,506 A | 11/1981 | Heberger | 428/341 |
| 4,861,669 A | 8/1989 | Gillery | 428/434 |
| 5,000,528 A * | 3/1991 | Kawakatsu | 359/585 |
| 5,085,926 A | 2/1992 | Iida et al. | 428/216 |
| 5,216,542 A * | 6/1993 | Szczyrbowski et al. | 359/588 |
| 5,278,221 A | 1/1994 | Siddiqui | 524/493 |
| 5,506,037 A * | 4/1996 | Termath | 428/216 |
| 5,589,280 A * | 12/1996 | Gibbons et al. | 428/626 |
| 5,691,044 A | 11/1997 | Oyama et al. | 428/216 |
| 5,744,227 A | 4/1998 | Bright et al. | 428/216 |
| 6,045,964 A * | 4/2000 | Ellis et al. | 430/200 |
| 6,111,698 A | 8/2000 | Woodard et al. | 359/585 |
| 6,114,043 A | 9/2000 | Joret | 428/428 |
| 6,188,512 B1 | 2/2001 | Woodard et al. | 359/359 |

FOREIGN PATENT DOCUMENTS

| | | | |
|---|---|---|---|
| JP | 61-055603 A | * | 3/1986 |
| JP | 63-242948 A | * | 10/1988 |

* cited by examiner

*Primary Examiner*—John Juba, Jr.
(74) *Attorney, Agent, or Firm*—Law Offices of Terry McHugh

(57) ABSTRACT

In a titanium nitride-based optical coating, the structural stability of the coating is enhanced by providing a damage-retardation base layer between the titanium nitride layer and a substrate. Where the optical coating is to provide solar control, the titanium nitride layer is selected primarily for achieving desired optical characteristics, while the thickness of the damage-retardation layer is selected primarily for achieving desired mechanical characteristics. The damage-retardation layer is formed of a grey metal, with nickel chromium being the preferred metal. The grey metal layer reduces the likelihood that the titanium nitride layer will crack. The tendency of such a layer to crack and form worm tracks is further reduced by exposing the substrate to a plasma preglow and/or by using a slip agent on the side of the substrate on which the layers are to be formed.

17 Claims, 4 Drawing Sheets

REDUCING THE SUSCEPTIBILITY OF TITANIUM NITRIDE OPTICAL LAYERS TO CRACK

TECHNICAL FIELD

The invention relates generally to methods and systems for coating a flexible substrate in order to achieve desired optical characteristics and more particularly to reducing the susceptibility of a titanium nitride film to cracking.

BACKGROUND ART

A wide range of single-layer coatings and multi-layer stacks are applied to light transmissive or reflective members in order to provide desired optical characteristics. For example, solar screening that increases the comfort level within the interior of a home, building or automobile can be obtained by providing the appropriate single-layer or multi-layer coating along the windows of the structure. A coating that provides solar screening is defined herein as one that has a relatively low transmissivity in both the visible range (400 to 700 nm) and the near infrared range (700 to 2100 nm). In comparison, wavelength selectivity is defined herein as referring to the relative transmissivities in the visible and near infrared portions of the solar spectrum.

It is known in the art to use metal nitride layers in window-energy control applications. Single layers of titanium nitride, zirconium nitride, and hafnium nitride have been specifically identified. As noted in U.S. Pat. No. 6,188,512 to Woodard et al., titanium nitride is particularly attractive, since titanium nitride films have desirable properties with respect to chemical stability and wavelength selectivity. The chemical stability of titanium nitride layers is well established in the art. Titanium nitride films are more transmissive in the visible portion ($T_{VIS}$) than in the near infrared portion, so that the wavelength selectivity is greater than 1. The Woodard et al. patent describes an embodiment in which titanium nitride layers are formed on opposite sides of a particular substrate, significantly raising the ratio of the measure of transmission at the wavelength of 550 nm to transmission at the wavelength of 1500 nm.

Single-layer or multi-layer optical coatings that include titanium nitride may be formed directly on a glass substrate or may be formed on a polymeric substrate which is subsequently applied to glass. U.S. Pat. No. 6,114,043 to Joret describes a layer stack that is formed on a glass substrate intended to be used as a window for a building or an automobile. The layer stack may be a solar protection coating of three layers that are applied directly to glass. The first of the three layers is the titanium nitride layer. The second layer is formed atop the titanium nitride layer as a silicon nitride layer having controlled amounts of oxygen and carbon. Then, a layer of silicon oxycarbide is formed to provide the outermost layer of the layer stack. All three of the layers are formed using gas-phase pyrolysis techniques. The Joret patent states that one function of the center layer is to protect the titanium nitride layer when the glass substrate is subsequently cut and heat treated in order to bend or toughen the coated glass. Thus, if the coated glass is bent in order to provide the shape for the windshield of a particular make of automobile, the center layer will provide protection for the titanium nitride layer during the bending process.

Titanium nitride layers are particularly susceptible to damage when the layers are formed along the surface of a flexible substrate. In the above-identified patent to Woodard et al., the titanium nitride is deposited on polyethylene terephthalate (PET). A web of PET can be coated and then systematically cut in order to provide the desired shapes for coating the various windows of an automobile, for example. However, titanium nitride coatings are ceramic films in compressive stress. As a result, problems occur in coatings having a titanium nitride layer. In particular, when a coated polymeric substrate is flexed, the titanium nitride layer has a tendency to crack. The cracks often form a serpentine pattern, so that the cracking may be referred to as "worm tracks." The thickness of the titanium nitride layer affects the susceptibility of the layer to cracking. A thin titanium nitride layer is less likely to crack. As one example, if a titanium nitride layer having a thickness of 7.4 nm is able to provide a $T_{VIS}$ of sixty percent, the layer is less prone to cracking as compared to a 20.4 nm layer that provides a $T_{VIS}$ of thirty-five percent.

What is needed is a means for reducing the susceptibility of a titanium nitride layer to stress cracking, while retaining the benefits of titanium nitride-based coatings, such as the benefits relating to wavelength selectivity and chemical resistance.

SUMMARY OF THE INVENTION

The structural stability of a titanium nitride-based optical coating on a generally transparent substrate is enhanced by providing a damage-retardation layer between the substrate and a layer of titanium nitride. The thickness of the titanium nitride layer is selected primarily for achieving desired optical characteristics, such as solar control, while the thickness of the damage-retardation layer is selected primarily for achieving desired mechanical characteristics. The damage-retardation layer is formed of a grey metal. The preferred grey metal is nickel chromium. The tendency of a titanium nitride layer to crack may be further reduced by exposing the substrate, such as a flexible polymeric substrate, to a plasma preglow and/or by using a slip agent on the side of the flexible polymeric substrate on which the grey metal and titanium nitride-based optical coating are formed.

In the solar control embodiment, the titanium nitride layer may define a single-layer optical coating having a visible light transmissivity ($T_{VIS}$) within the range of ten percent to sixty percent. The damage-retardation layer and the titanium nitride layer are deposited upon a flexible polymeric substrate, such as a web of PET. Preferably, both layers are formed by sputter deposition. The grey metal material may be selected from at least one of the group consisting of Ni, Cr, Ti, W, Zr, Hf, Ta, Nb, Fe, V and Mo, as well as alloys, such as Monel, Inconel and stainless steel. Testing indicates that nickel chromium is a preferred material.

Less than all of the dynamics which lessen the tendency of titanium nitride to crack upon pressure of the substrate when the intermediate layer of grey metal is used are fully understood. Since the grey metal layer is more malleable than the titanium nitride layer, the grey metal layer may relieve some of the stress placed on the titanium nitride layer when the substrate is flexed. Moreover, because the grey metal will reduce light transmission, the titanium nitride layer may be reduced in thickness while the optical coating remains at the target level of $T_{VIS}$. To obtain a target level of $T_{VIS}$ with a single material, a titanium nitride layer would have to be approximately three times thicker than a nickel chromium layer. Thus, the use of nickel chromium to form the damage-retardation layer allows the titanium nitride layer to be reduced to a thickness that is less prone to cracking. It is also believed that the nickel chromium layer serves as a primer layer and improves the adhesion of the titanium nitride layer to the polymeric substrate.

The plasma preglow that is used to improve structural stability of the titanium nitride-based coating may be performed in an environment in which the glow gas is one or a combination of argon, oxygen, or nitrogen. Plasma preglow treatments to polymeric substrates increase adhesion by generating desired functional groups or by simply increasing surface roughness. Either or both of these aspects may lessen the tendency of sputtered titanium nitride layers to crack and debond when the substrate is flexed.

It is known to apply slip agents to substrates to increase adhesion of inks, dyes or the like to the substrate. A slip agent is a chemical coating which provides an increased degree of surface roughness to PET and similar substrates. A slip agent is defined herein as an additive that is provided primarily to reduce the coefficient of friction of a substrate. Slip agents for polyester substrates are known in the art. As one example, glass spheres may be added to a polyester substrate or may coat the substrate to create a textured surface. In accordance with the present invention, the slip agent is employed to reduce the tendency of the sputter deposited titanium nitride layer to crack.

An advantage of the invention is that the structural stability of a titanium nitride-based optical coating for a transparent substrate is significantly enhanced. As applied to embodiments in which titanium nitride is used as a single-layer solar control coating of a flexible substrate, "worm tracks" are less likely to occur upon flexure of the substrate. Consequently, field failures of a solar control product are reduced.

DETAILED DESCRIPTION

Figure 1:
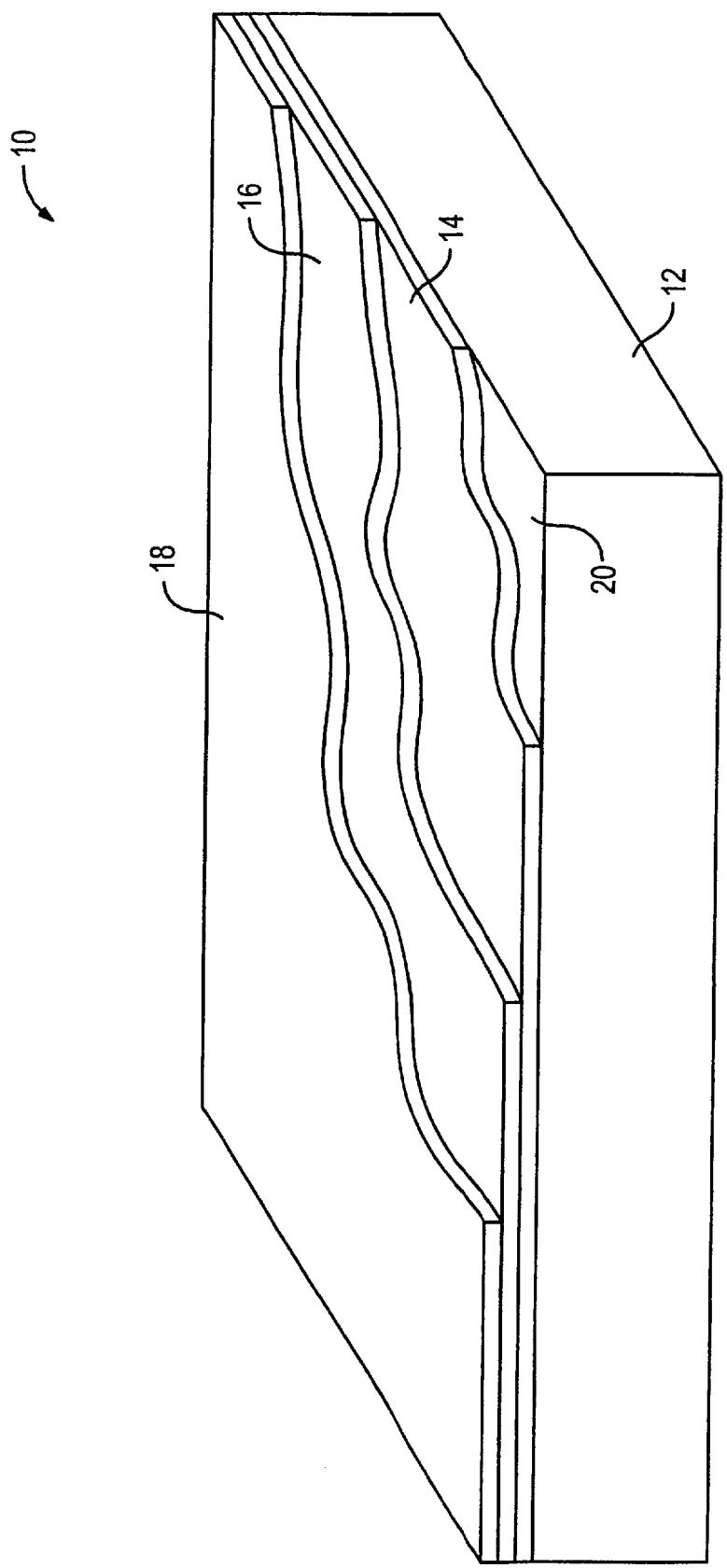
FIG. 1 is a perspective view of one embodiment of a titanium nitride-based coating having a damage-retardation layer in accordance with the invention.
Figure 2:
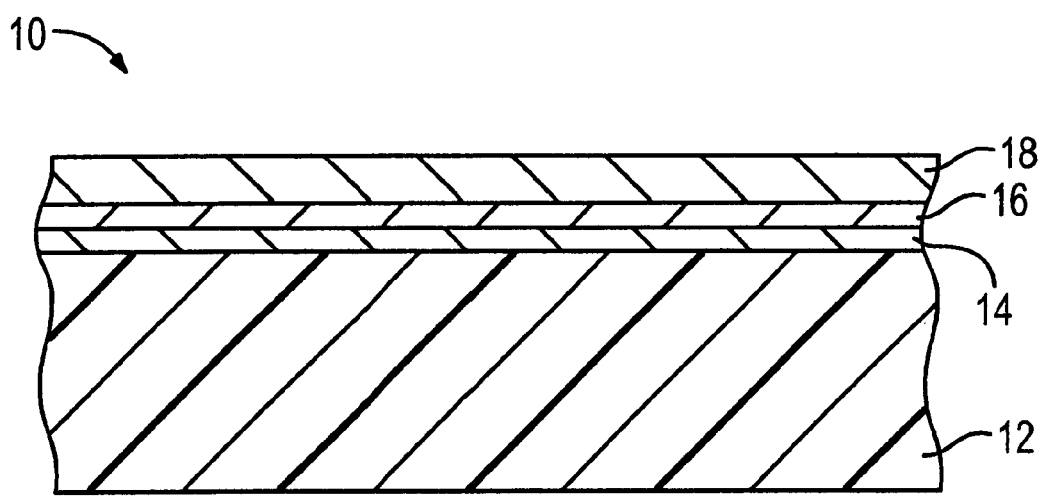
FIG. 2 is a side sectional view of the optical member of FIG. 1.

With reference to FIGS. 1 and 2, an optical member 10 will be described with reference to one possible embodiment of the invention. The illustrated and described optical member is considered to be the preferred embodiment. However, the invention may be used with other titanium nitride-based optical coatings which are susceptible to cracking.

The optical member 10 includes a substrate 12, which may be a flexible substrate for attachment to a window, such as a windshield of an automobile or a window of a home or office building. While not shown in FIGS. 1 and 2, the substrate may be in web form before layers are applied to the substrate. One acceptable substrate material is PET.

In FIG. 1, only the substrate 12 is shown intact. The series of coating elements 14, 16 and 18 have progressively larger portions that have been removed for the purpose of illustration. Consequently, the upper surface 20 of the substrate 12 is shown as being exposed at one corner. The optical member includes a slip agent 14 on the upper surface 20.

Slip agents are known in the art. U.S. Pat. No. 5,278,221 to Siddiqui and U.S. Pat. No. 4,302,506 to Heberger disclose slip agents for polyester substrates, such as PET. In the Siddiqui patent, the slip agent is described as being an addition of glass spheres and an addition of a fumed silica. The glass spheres have a particle size distribution and quantity that are selected to improve the dynamic coefficient of friction of the polyester film, while the fumed silica is used to change the static coefficient of friction. Slip agents have been applied to polymeric substrates in order to increase the adhesion of inks, dyes and the like to the substrates. In comparison, the slip agent 14 of FIGS. 1 and 2 is used to control stress cracking by a titanium nitride layer 18.

Between the slip agent 14 and the titanium nitride layer 18 is a damage-retardation layer 16. The damage-retardation layer is formed of a grey metal. In the preferred embodiment, the grey metal is at least one material from the group consisting of Ni, Cr, Ti, W, Zr, Hf, Ta, Nb, V and Mo. In the most preferred embodiment, the grey metal is nickel chromium. Also in the preferred embodiment, the thickness of the grey metal layer 16 is in the range of 1 nm to 20 nm. The thickness of the grey metal layer is primarily selected on the basis of achieving desired mechanical characteristics for further reducing the likelihood that the titanium nitride layer 18 will crack. However, the optical characteristics of the composite optical member 10 must be considered in selecting the optimal thickness of the grey metal layer. For applications of the invention as a solar control coating, the $T_{VIS}$ for the optical member should be in the range of ten percent to sixty percent. If the $T_{VIS}$ value is relatively high (e.g., $T_{VIS}$=sixty percent), the thickness of the titanium nitride layer will be less than 10 nm, so that the concern regarding stress cracking is less severe. However, for titanium nitride layers having a thickness greater than 10 nm, the benefits of the grey metal layer are particularly apparent. In the preferred embodiment, the grey metal layer of nickel chromium is used for titanium nitride layers having a thickness in the range of 10 nm to 50 nm. It has been determined that the thickness of a nickel chromium layer should be at least five percent of the thickness of the titanium nitride layer.

Grey metal, and particularly nickel chromium, is selected for the damage-retardation layer for the ability to provide relatively low reflection and the tendency to bond well with polymeric substrates. That is, the damage-retardation layer is designed to mechanically cooperate with the substrate and titanium nitride layer, rather than optically cooperating with the titanium nitride layer in the same manner as a conventional antireflective coating in which successive layers have a quarter wavelength-quarter wavelength (QQ) relationship with a target wavelength of the coating. The grey metal layer 16 lessens the tendency for worm tracks to appear within the titanium nitride layer 18 when the substrate 12 is flexed. In addition to improving the adhesion of the titanium nitride layer to the substrate, a nickel chromium layer is more malleable than titanium nitride, so that it may relieve some of the stress placed on the titanium nitride layer as the substrate is flexed.

The slip agent 14 is shown as being a separate layer, but may be integrated into the substrate 12. For example, if the substrate is formed of PET, particles may be added to the PET polymer so as to protrude from the substrate surface. The slip agent was found to decrease the tendency of titanium nitride to crack or debond from the substrate. The increased degree of surface roughness improves the adhesion of layers to the substrate.

A third contribution to increasing the stability of the titanium nitride layer 18 is provided by using a plasma preglow. Acceptable glow gases include argon, oxygen, nitrogen, and combinations of argon, oxygen, and nitrogen. Such treatments to polymeric substrates 12 are known to increase adhesion by generating desired functional groups or by increasing surface roughness. The increase in adhesion lessens the tendencies of sputtered coatings to crack and debond as the polymeric substrate 12 is flexed.

Figure 3:
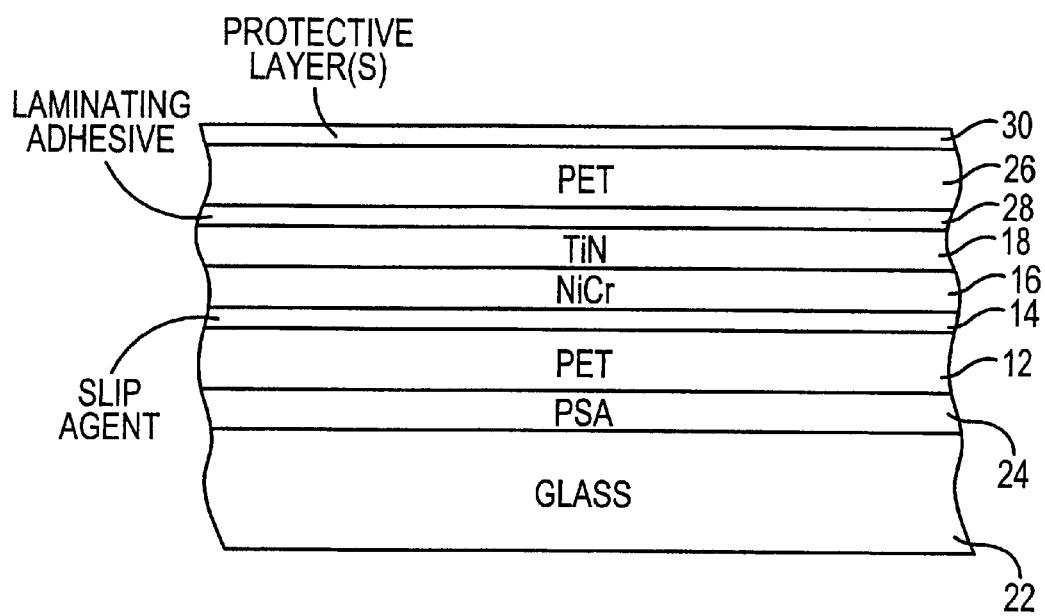
FIG. 3 is a side view of the optical member of FIG. 2 bonded to glass.

In FIG. 3, the optical member is shown as being adhered to a glass member 22. Pressure sensitive adhesive (PSA) may be used to bond the optical member to the glass member, which may be the windshield of an automobile or a window of a building or home. A second PET substrate 26 is coupled to the titanium nitride layer 18 by a laminating adhesive 28. One or more protective layers 30 may be used at the exterior of the sequence of substrates and layers to increase the durability of the arrangement. As one possibility, the protective layers may include a hardcoat layer and a lubricating layer. The lubricating layer may be a fluorocarbon having a low surface energy and having anti-friction properties to facilitate cleaning and scratch resistance. The hardcoat layer may be a silica-based hardcoat, a silozane hardcoat, a melamine hardcoat, an acrylic hardcoat, or a similar material. Such materials typically have refractive indices of between 1.40 and 1.60. An acceptable thickness range is from 1 $\mu$m to 20 $\mu$m. While not shown in FIG. 3, each surface of the two PET substrates 12 and 26 may include a hardcoat layer.

A thin primer layer may be used to promote adhesion of the sputtered layers to the hardcoat layer, if one is used. The primer layer may be a metal or semiconductor that undergoes conversion, such as oxidation, after deposition, so as to yield substantially transparent, substantially colorless inorganic material. Examples of useful primer materials include silicon, titanium, chromium, and nickel. Preferably, the primer layer has a thickness of less than 50 Å.

Figure 4:
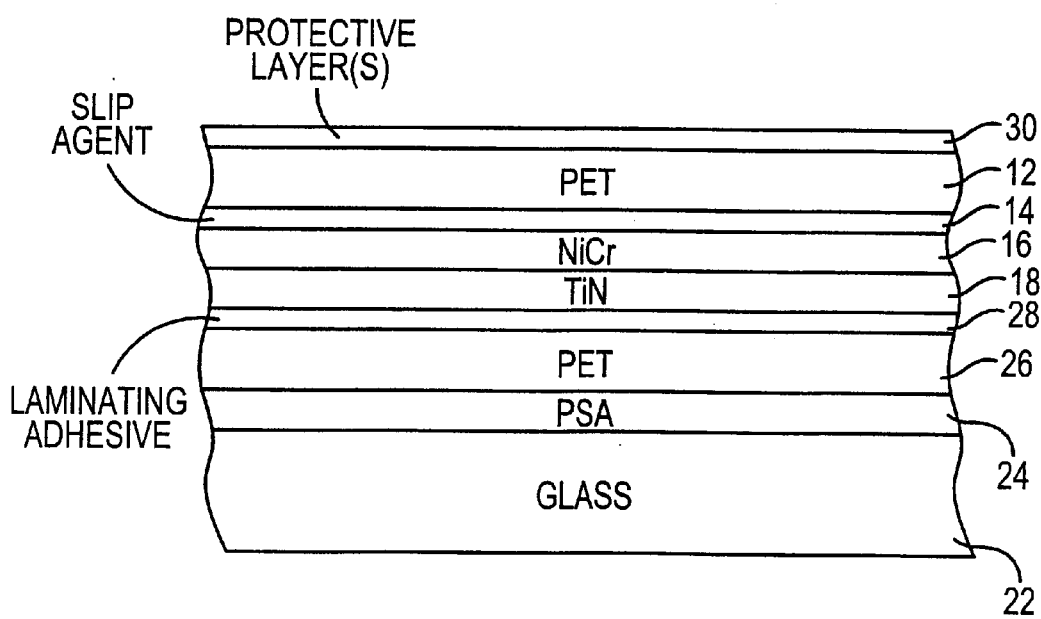
FIG. 4 is a side view of a second embodiment of the optical member bonded to glass.

Referring now to FIG. 4, the same components as FIG. 3 are shown, but the order of the two PET substrates 12 and 26 has been reversed and the PET substrate 12 has been inverted. As in FIG. 3, hardcoat layers, adhesion promotion layers, and slip agent layers may be added without diverting from the invention.

Other modifications to the embodiment of FIG. 3 may be made without diverging from the invention. For example, rather than one NiCr/TiN arrangement formed on one substrate, each of the substrates 12 and 26 may have layers of NiCr and TiN, with the NiCr/TiN arrangements sandwiched between the substrates when a laminating adhesive is used to couple the two laminates.

Figure 5:
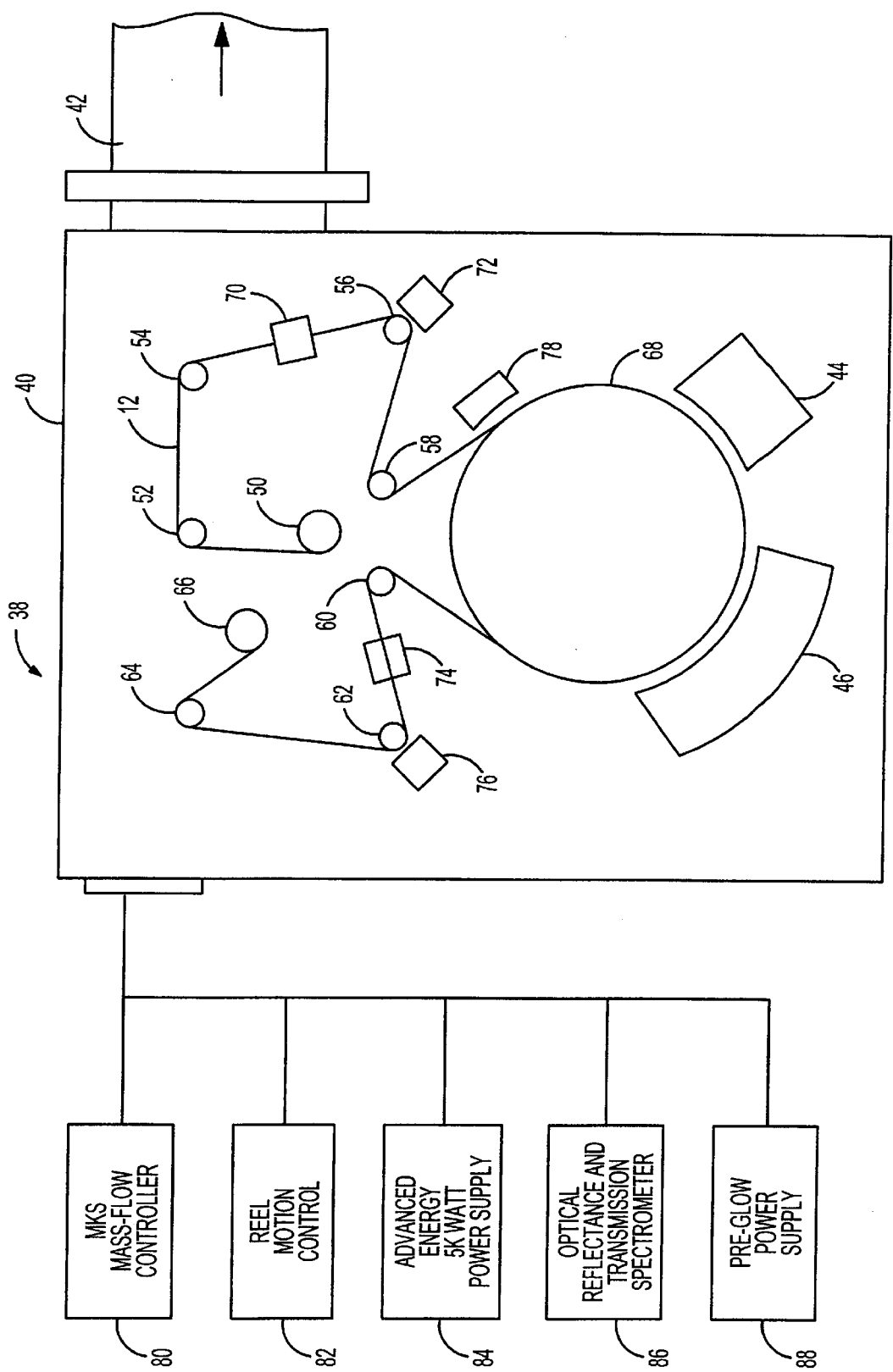
FIG. 5 is a schematic view of a sputtering apparatus for fabricating the optical members of FIGS. 1–3.

FIG. 5 shows a continuous web coating sputtering apparatus 38 that may be used to form the optical member 10 of FIGS. 1 and 2. The web coating system includes a vacuum chamber 40 that is evacuated by applying negative pressure to an evacuation line 42. Contained within the chamber is a drive mechanism for moving a sheet of flexible substrate material 12 past a pair of magnetron sputtering stations 44 and 46. The components for driving the web include a feed roller 50, idlers 52, 54, 56, 58, 60, 62 and 64, and a take-up roller 66. The web of substrate material passes around a chilled idler drum 68.

A pair of monitors 70 and 72 may be used to determine the optical properties of the web prior to the application of coatings, while a second pair of monitors 74 and 76 determines the optical properties following the application of coatings. The optical properties of concern will vary with the target application. The sputtering apparatus 38 is configured to enable simultaneous and serial sputter depositions of layers on the web 12, using the separate magnetron cathodes of the stations 44 and 46.

As the web of substrate material 12 is rotated around the circumference of the drum 68, the substrate first encounters a preglow station 78. As previously noted, a preglow treatment of a polymeric substrate will increase the adhesion of subsequently deposited layers on the substrate by generating desired functional groups or by simply increasing surface roughness. The station 44 may be used to deposit the damage-retardation layer 16. The slip agent 14 is preferably introduced before the web 12 is mounted within the sputtering apparatus 38. The second station 46 is used to deposit the titanium nitride layer 18. Multiple layers can be formed by a same station merely by providing multiple passes.

The control and monitoring of the sputtering apparatus 38 is accomplished using equipment and sensors that are standard in a coating machine of this type. A mass-flow controller 80 is used for regulating gas flow into the pair of stations 44 and 46. A reel motion controller 82 regulates the tension, speed and distance of the web 12 as it moves through the apparatus 38. One or more AC or DC power supplies 84 provide power to the two stations. An optical monitoring system 86 is used to determine the optical characteristics of the web material over a spectral region of 400 nm to 2000 nm. The optical monitoring system is connected to the four monitors 70, 72, 74 and 76. A preglow power supply 88 controls the operation of the preglow station 78.

Experiments were conducted to determine the benefits of the above-identified techniques for reducing the likelihood that titanium nitride will be damaged when a substrate having a coating of titanium nitride is flexed. Prior to the experimentation which is shown in Table 1, it was found that a TiN$_x$ coating with a T$_{VIS}$ value of sixty percent was far less prone to cracking than a TiN$_x$ coating with a T$_{VIS}$ value of thirty-five percent. This is a direct result of the difference in thicknesses. The coating with the T$_{VIS}$ value of sixty percent was approximately 7.4 nm thick, while the coating with the thirty-five percent T$_{VIS}$ value was approximately 20.4 nm. In order to provide sufficient information regarding coating cracking tendencies, all ten samples identified in Table 1 had a target visible light transmissivity of thirty-five percent. The T$_{VIS}$ values in Table 1 all exceed this target value since T$_{VIS}$ was originally measured in situ, but the recordings were based upon measurements made after the samples were removed from the vacuum chamber, so that some oxidation had occurred.

TABLE 1

| Sample # | Description | TiN thickness in nm | NiCr thickness in nm | % NiCr thickness | $T_{VIS}$ | $T_{SOL}$ | Selectivity | Worm Rating |
|---|---|---|---|---|---|---|---|---|
| 1 | NiCr/TiN; 2.0x Linespeed; Slip Side | 10.2 | 3.12 | 31% | 38.7 | 30.8 | 1.26 | 1 |
| 2 | NiCr/TiN; 1.5x Linespeed; Slip Side | 13.6 | 2.08 | 15% | 38.3 | 30.0 | 1.28 | 1.5 |
| 3 | NiCr/TiN; 1.2x Linespeed; Slip Side | 17.0 | 1.04 | 6% | 38.2 | 27.6 | 1.38 | 2.5 |
| 4 | TiN only; Slip Side | 20.4 | 0.00 | 0% | 38.6 | 26.8 | 1.44 | 3.5 |
| 5 | NiCr/TiN; 2.0x Linespeed; Bare Side | 10.2 | 3.12 | 3.12% | 38.4 | 30.4 | 1.26 | 2 |
| 6 | NiCr/TiN; 1.5x Linespeed; Bare Side | 13.6 | 2.08 | 15% | 37.9 | 28.5 | 1.33 | 3 |
| 7 | NiCr/TiN; 1.2x Linespeed; Bare Side | 17.0 | 3.12 | 6% | 37.8 | 27.1 | 1.39 | 4 |
| 8 | TiN only; Bare Side | 20.4 | 0.00 | 0% | 37.9 | 26.1 | 1.45 | 5 |
| 9 | NiCr only; Bare Side | 0.0 | 6.31 | 100% | 39.3 | 36.6 | 1.07 | 0 |
| 10 | TiNx only; Bare side; No Preglow | 20.4 | 0.00 | 0% | 36.8 | 25.6 | 1.44 | 7 |

The ten samples were acquired using a sputtering apparatus 38 as shown in FIG. 5. In such an apparatus, the drum 68 is water cooled to prevent thermal distortion of the polymeric substrate web 12. The optical monitoring system 86 used the monitors 70, 72, 74 and 76 to optically monitor ultraviolet, visible, and infrared transmission and reflection of the web. While not shown in FIG. 5, the apparatus was also equipped with a contactless sheet resistance monitor to determine the conductivity of the sputtered coating. For the experiments, the apparatus 38 was equipped with a DC plasma preglow at the preglow station 78, a DC magnetron cathode at the station 44, and an AC dual magnetron cathode at the following station 46. Each plasma source was located in a separate mini chamber which isolated the local gas environments for each plasma. An aluminum glow rod was used as the cathode in the plasma preglow. A nickel chromium target was equipped in the DC magnetron, while titanium targets were installed in the AC dual magnetron.

Titanium nitride layers were deposited for the various samples of Table 1 with a closed-loop, computer-controlled nitrogen gas flow based on the plasma emission intensity at 450 nm. With the argon flow set as required to obtain 3 milliTorr pressure (i.e., 93 SCCMs) and the power set at 5 kW, the PEM emission intensity was set to 10 volts. The PEM setpoint voltage was then reduced, causing the control loop to add nitrogen to the titanium plasma. As the nitrogen was added, the web linespeed was adjusted to maintain a visible light transmission of approximately thirty-five percent. The PEM setpoint was lowered to obtain the minimum sheet resistance. This preferred PEM set point corresponded to a deposited film with a nitrogen content as appropriate to maximize wavelength selectivity.

It should be noted that in spite of efforts that were taken to minimize oxygen background gases, in all practical vacuum web coaters, some incorporation of oxygen into the titanium nitride layer occurs. Thus, in practice, what is deposited is actually titanium oxynitride. However, if excessive oxygen is incorporated into the titanium nitride coating, the wavelength selectivity will be adversely affected. It is believed that the oxygen-to-nitrogen partial pressure ratio during the sputtering process should be less than 0.5 to ensure a $TiO_xN_y$ layer with adequate wavelength selectivity.

The substrate material 12 used in the experimentation of Table 1 was a 1 mil PET substrate, with a slip side (i.e., a side having a slip agent) and a bare side.

To better explain the experimental process, detailed descriptions of fabricating Samples 6 and 8 will be provided. For Sample 8 a single layer of $TiN_x$ was formed on the bare side of the PET substrate. The linespeed was set at 12.76 mm/second. The DC preglow was operated with an airflow of 35 SCCMs and a current of 200 mA to obtain a pressure of 29 milliTorr and a voltage of 1500 volts. The AC titanium targets were powered at 5.2 kW with 87 SCCMs of argon and 15.2 SCCMs of $N_2$ in order to obtain a mini chamber pressure of 3.16 milliTorr. The PEM voltage setpoint was 5.7 volts. The in situ visible light transmission was thirty-five percent.

Regarding Sample 6, the sample was made by increasing the linespeed and preglow current used in Sample 8 by 1.5 times. Then, NiCr (80/20 alloy) was added to obtain an overall in situ visible light transmission of thirty-five percent. The linespeed was set at 19.14 mm/second. The DC preglow was operated with an airflow of 42.3 SCCMs and a current of 300 mA in order to obtain a pressure of 33 milliTorr and a voltage of 1500 volts. The AC titanium targets were powered at 5.2 kW with 87 SCCMs of argon and 15.2 SCCMs of $N_2$ to obtain a mini chamber pressure of 3.16 milliTorr. The PEM voltage setpoint was 5.7 volts. The DC magnetron NiCr target was powered at 0.35 kW with 28.5 SCCMs of argon added to obtain a pressure of 3.18 milliTorr.

For all of the samples of Table 1, the size of the NiCr target was 15.75 inches (400 mm) by 5.25 inches (133.55 mm). Each of the titanium targets was 15.625 inches (396.8 mm) by 3.25 inches (82.5 mm).

MEASUREMENTS OF SAMPLES

The thicknesses of the $TiN_x$ and NiCr coatings for the samples of Table 1 were determined by setting the power to each cathode of the stations 44 and 46 of FIG. 5 to a fixed value, then noting the visible light transmission obtained at different linespeeds. Subsequently, the linespeed was dropped to a very low value (e.g., 0.5 mm/second) and a strip of tape was placed on the PET substrate and coated. The tape was removed from the PET substrate and the step height of the coating was measured using a commercially available profilometer. Since 1/linespeed varies linearly with optical density (where optical density is -log (fractional light transmission)), the correspondence of the coating thickness to various light transmissions can be calculated.

After the samples were prepared, a test method was required to determine the tendencies of the coatings to crack or form worm trails. For this test, a 6 inch by 14 inch sample (152.4 mm by 355.6 mm sample) was grasped at each end in the long direction. While the sample was held loosely, one end was rotated ninety degrees relative to the other. The sample was then snapped taut. This procedure was repeated five times. The sample was then inspected while being illuminated by a slide projector lamp. Each sample was given a numerical rating that depended upon the number and the size of worm tracks that were detected. A sample with no worm tracks was given a rating of "0, " while the worst sample was given a rating of "7. " As shown in Table 1, the nickel chromium (80/20 alloy)-only sample (i.e., Sample 9) was given the 0 rating, while the no-preglow $TiN_x$-only sample (i.e., Sample 10) received the rating of 7. Measurements regarding optical and solar properties were acquired using commercially available devices and known methods.

Sample Results

In the description section of Table 1, the reference to 2.0x linespeed refers to a stack in which after the $TiN_x$ layer was tuned to a transmission of thirty-five percent, the linespeed was increased by a factor of two and the nickel chromium was added as required to return to a $T_{VIS}$ measurement of approximately thirty-five percent. The layer thicknesses are shown within the table.

The $T_{VIS}$ and $T_{SOL}$ (solar transmissivity) values were determined ten months after the samples were prepared. One of the parameters included in Table 1 is selectivity. As used in the table, selectivity refers to the $T_{VIS}$ value divided by the $T_{SOL}$ value. A higher selectivity means the coating preferentially transmits more visible light than near infrared light. This is generally a preferred property for optical members that are coated to provide solar screening and that are then applied to window glass. From the data in Table 1, it can be seen that there are indeed multiple factors that affect the tendency of a coating to form worm tracks. This tendency is reduced by adding the grey metal layer (nickel chromium) between the substrate and the titanium nitride, by plasma preglowing the substrate, and by depositing the coating on the slip side of the substrate. Of these, adding the grey metal underlayer is the most effective at preventing worm tracks.

Another important factor to be considered is selectivity. Obtaining a high selectivity is one of the benefits of using titanium nitride, as compared to simple metals. As the nickel chromium content of the samples of table 1 increases, the selectivity decreases. Thus, the amount of nickel chromium should be limited to that required to obtain adequate resistance to the generation of worm tracks. In the preferred embodiment, the selectivity is greater than 1.15. Based upon the results of experimentation, the thickness of the grey metal base layer should be in the range of 1 nm to 20 nm and the thickness of the titanium nitride layer should be in the range of 10 nm to 50 nm.

What is claimed is:

1. A method of providing solar control comprising:
   providing a flexible substrate having a first surface; and
   providing a damage-retardation layer at said first surface to protect a subsequently formed optical coating, said damage-retardation layer being a grey metal;
   providing said optical coating as a titanium nitride-based structure having a titanium nitride layer on a side of said damage-retardation layer opposite to said flexible substrate, thereby forming a coated flexible substrate; and
   attaching said coated flexible substrate to a rigid substrate through which solar control is sought;
   wherein a thickness of said titanium nitride layer is selected primarily for achieving desired optical characteristics and a thickness of said grey metal is selected primarily for achieving desired mechanical characteristics in retarding damage to said titanium nitride layer, and wherein providing said damage-retardation layer includes selecting a material to achieve desired characteristics with regard to low reflectivity and physical bonding to said titanium nitride layer.

2. The method of claim 1 wherein providing said optical coating consists of depositing said titanium nitride layer as a single-layer solar control coating, said single-layer solar control coating and said damage-retardation layer combining to provide a visible light transmissivity in the range of ten percent to sixty percent.

3. The method of claim 1 wherein providing said grey metal layer is a step of depositing a nickel chromium layer.

4. The method of claim 3 wherein depositing said nickel chromium layer is to a thickness in the range of 1.04 nm to 3.12 nm and wherein providing said titanium nitride layer defines a thickness in the range of 10 nm to 50 nm.

5. The method of claim 3 wherein said nickel chromium and titanium nitride layers are sputter deposited and wherein providing said flexible substrate is a step of providing a generally transparent polymeric substrate having a slip agent on which said titanium nitride is sputter deposited.

6. The method of claim 1 wherein providing said damage-retardation layer includes selecting at least one material from the group Ni, Cr, Ti, W, Zr, Hf, Ta, Nb, Fe, V and Mo in order to achieve said desired characteristics with regard to physical bonding and low reflectivity, wherein a ratio of said thickness of said grey metal to said thickness of said titanium nitride is in the range of 1:3 to 1:20.

7. The method of claim 6 further comprising exposing said flexible substrate to a plasma preglow prior to forming said damage-retardation layer on said first surface, thereby reducing susceptibility of said titanium nitride layer to stress cracking after said optical coating is provided.

8. The method of claim 7 further comprising providing a slip agent at said first surface of said flexible substrate such that said susceptibility is further reduced.

9. An optical member comprising:
   a flexible polymeric substrate;
   a grey metal layer on said polymeric substrate, said grey metal layer having a thickness in the range of 1 nm to 20 nm;
   a single-layer optical coating of titanium nitride, said optical coating having a thickness in the range of 10 nm to 50 nm and having a visible light transmissivity in the range of ten percent to sixty percent, said single-layer optical coating being on a side of said grey metal layer opposite to said flexible polymeric substrate; and a slip agent on a surface of said flexible polymeric substrate upon which said grey metal layer is formed.

10. The optical member of claim 9 wherein said grey metal layer is formed of at least one material selected from the group consisting of Ni, Cr, Ti, W, Zr, Hf, Ta, Nb, Fe, V and Mo.

11. The optical member of claim 9 wherein said grey metal layer is a nickel chromium layer.

12. The optical member of claim 9 wherein said flexible polymeric substrate is a transparent web of PET.

13. A method of forming an optical member comprising:

providing a generally transparent substrate;

forming a layer of NiCr on a first surface of said substrate; and forming a single-layer solar control coating in contact with said layer of NiCr, said solar control coating being a TiN layer;

wherein forming said layer of NiCr includes selecting a layer thickness at least partially based upon inhibiting cracking of said TiN layers, and wherein forming said single-layer solar control coating includes selecting a layer thickness primarily based on achieving a target level of transmissivity of visible light, said layer thickness of said NiCr thereby functioning to provide structural stability of said TiN layer which is dimensioned to determine optical characteristics.

14. The method of claim 13 wherein:

forming said layer of NiCr includes sputtering NiCr to said layer thickness in the range of 1 nm to 20 nm; and forming said TiN layer includes sputtering TiN to a thickness in the range of 10 nm to 50 nm, said TiN layer and said layer of NiCr combining to provide a visible light transmissivity in the range of ten percent to sixty percent.

15. The method of claim 13 further comprising exposing said transparent substrate to a plasma preglow prior to forming said layer of NiCr.

16. The method of claim 15 wherein said step of exposing includes using at least one of oxygen, nitrogen and argon in providing said plasma preglow.

17. The method of claim 15 wherein providing said generally transparent substrate includes using a polymeric substrate having a slip agent on a side upon which said layer of NiCr is formed.

* * * * *